US012684830B2

(12) United States Patent
Zhang et al.

(10) Patent No.: US 12,684,830 B2
(45) Date of Patent: Jul. 14, 2026

(54) SEMICONDUCTOR STRUCTURE, METHOD OF FORMING THE SEMICONDUCTOR STRUCTURE, AND SEMICONDUCTOR DEVICE

(71) Applicant: Fujian Jinhua Integrated Circuit Co., Ltd., Quanzhou City (CN)

(72) Inventors: Janbo Zhang, Quanzhou City (CN); Enping Cheng, Quanzhou City (CN); Li-Wei Feng, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 1050 days.

(21) Appl. No.: 17/845,998

(22) Filed: Jun. 21, 2022

(65) Prior Publication Data

US 2022/0406890 A1 Dec. 22, 2022

(30) Foreign Application Priority Data

Jun. 22, 2021 (CN) .......................... 202110691169.6
Jun. 22, 2021 (CN) .......................... 202121394865.2

(51) Int. Cl.
*H10D 62/10* (2025.01)
*H10D 64/01* (2025.01)
(Continued)

(52) U.S. Cl.
CPC ......... *H10D 62/115* (2025.01); *H10D 64/021* (2025.01); *H10W 10/011* (2026.01); *H10W 10/10* (2026.01)

(58) Field of Classification Search
CPC .. H10D 62/115; H10D 64/021; H01L 21/762; H10W 10/011; H10W 10/10
See application file for complete search history.

(56) References Cited

U.S. PATENT DOCUMENTS 10,050,149 B1 * 8/2018 Huang ............... H10D 30/6211
10,269,808 B2 4/2019 Kim
(Continued)

FOREIGN PATENT DOCUMENTS

CN 111640751 A 9/2020
CN 111968977 A 11/2020
CN 212542444 U * 2/2021

*Primary Examiner* — Britt Hanley
*Assistant Examiner* — Casey Paul Boatman
(74) *Attorney, Agent, or Firm* — Winston Hsu

(57) ABSTRACT

A semiconductor structure, a fabricating method thereof and a semiconductor device, the structure includes a substrate having a STI region and an AA, with an upper surface of the STI region lower than an upper surface of the AA; a stacked covered on the substrate; a first insulating layer covered the stacked structure, a second insulating layer covered the first insulating layer, and a third insulating layer covered the second insulating layer, over the STI region; a first insulating layer covered the stacked structure, over the AA, with an upper surface of the first insulating layer coplanar with an upper surface of the third insulating layer. The structure provides a semiconductor structure having a flat upper surface, avoiding polishing the first insulating layer over the AA to level with the first insulating layer over the STI region, greatly increasing the leakage risk, and reducing working stability of semiconductor devices.

11 Claims, 7 Drawing Sheets

(51) Int. Cl.
     H10W 10/00      (2026.01)
     H10W 10/10      (2026.01)

(56)            References Cited

U.S. PATENT DOCUMENTS

| | | | |
|---|---|---|---|
| 2005/0014330 | A1 | 1/2005 | Park |
| 2017/0207129 | A1* | 7/2017 | Tseng .................... H01L 23/535 |
| 2021/0098571 | A1 | 4/2021 | Lai |
| 2021/0313422 | A1 | 10/2021 | Lai |
| 2024/0047519 | A1 | 2/2024 | Lai |

\* cited by examiner

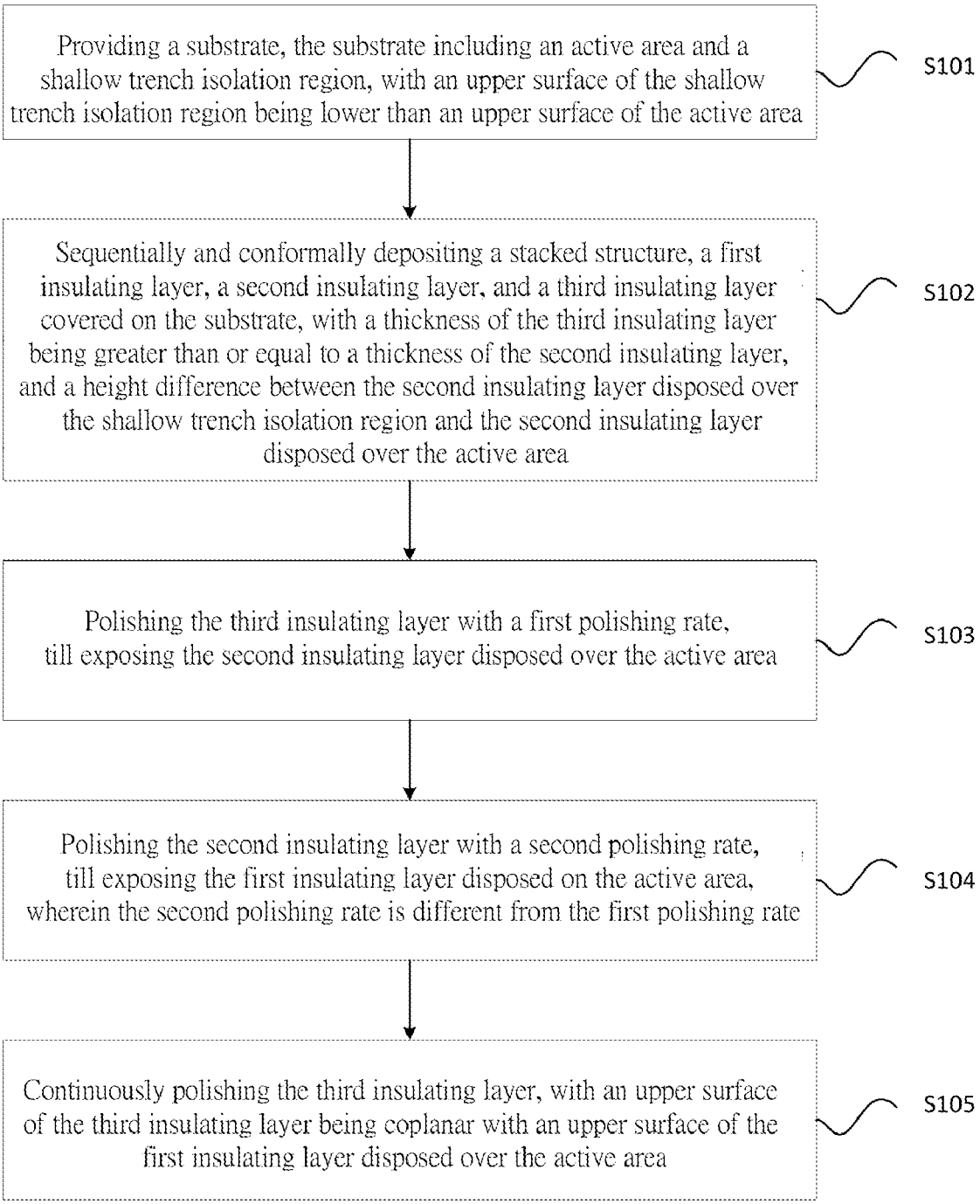

Providing a substrate, the substrate including an active area and a shallow trench isolation region, with an upper surface of the shallow trench isolation region being lower than an upper surface of the active area    S101

Sequentially and conformally depositing a stacked structure, a first insulating layer, a second insulating layer, and a third insulating layer covered on the substrate, with a thickness of the third insulating layer being greater than or equal to a thickness of the second insulating layer, and a height difference between the second insulating layer disposed over the shallow trench isolation region and the second insulating layer disposed over the active area    S102

Polishing the third insulating layer with a first polishing rate, till exposing the second insulating layer disposed over the active area    S103

Polishing the second insulating layer with a second polishing rate, till exposing the first insulating layer disposed on the active area, wherein the second polishing rate is different from the first polishing rate    S104

Continuously polishing the third insulating layer, with an upper surface of the third insulating layer being coplanar with an upper surface of the first insulating layer disposed over the active area    S105

FIG. 3

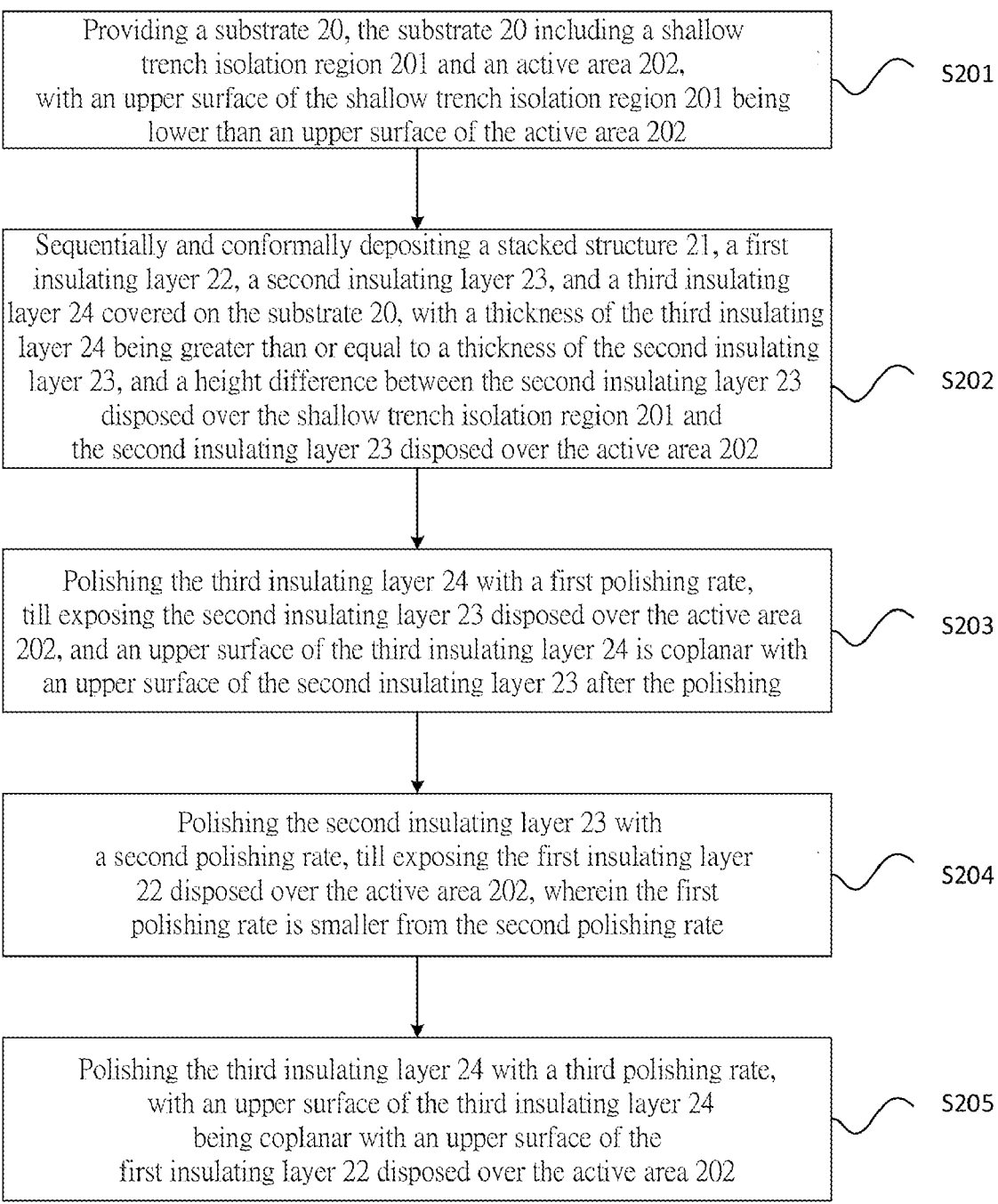

Providing a substrate 20, the substrate 20 including a shallow
trench isolation region 201 and an active area 202,
with an upper surface of the shallow trench isolation region 201 being
lower than an upper surface of the active area 202

S201

Sequentially and conformally depositing a stacked structure 21, a first
insulating layer 22, a second insulating layer 23, and a third insulating
layer 24 covered on the substrate 20, with a thickness of the third insulating
layer 24 being greater than or equal to a thickness of the second insulating
layer 23, and a height difference between the second insulating layer 23
disposed over the shallow trench isolation region 201 and
the second insulating layer 23 disposed over the active area 202

S202

Polishing the third insulating layer 24 with a first polishing rate,
till exposing the second insulating layer 23 disposed over the active area
202, and an upper surface of the third insulating layer 24 is coplanar with
an upper surface of the second insulating layer 23 after the polishing

S203

Polishing the second insulating layer 23 with
a second polishing rate, till exposing the first insulating layer
22 disposed over the active area 202, wherein the first
polishing rate is smaller from the second polishing rate

S204

Polishing the third insulating layer 24 with a third polishing rate,
with an upper surface of the third insulating layer 24
being coplanar with an upper surface of the
first insulating layer 22 disposed over the active area 202

SEMICONDUCTOR STRUCTURE, METHOD OF FORMING THE SEMICONDUCTOR STRUCTURE, AND SEMICONDUCTOR DEVICE

BACKGROUND OF THE INVENTION

1. Field of the Invention

The present invention relates generally to a semiconductor technique, and more particularly to a semiconductor structure, a method of forming a semiconductor structure, and a semiconductor device.

2. Description of the Prior Art

In the currently fabrication of semiconductor structures, a plurality of planarization processes is required to be performed in order to provide a flat working surface for the subsequent processes. For the substrate having a shallow trench isolation (STI) region and an active area (AA), the upper surface of the shallow trench isolation region is lower than that of the active area while performing a planarization process on a surface of the substrate, due to different materials of the shallow trench isolation region and the active area. Accordingly, the stacked structure and the mask layer formed in the subsequent depositing process will be formed conformally. In order to provide a flat working surface for the subsequent processes, the mask layer covered on the active areas is usually required to be polished to thin out the mask layer thereby, and however, which greatly increases the risk of leakage, and reduces the working stability of semiconductor devices.

SUMMARY OF THE INVENTION

The technical problem to be solved by the present invention is how to provide a semiconductor structure with a flat upper surface to reduce the risk of leakage and improve the stability of semiconductor devices.

In order to solve the above technical problems, the present invention provides a semiconductor structure, a method of fabricating a semiconductor structure, and a semiconductor device.

A first object of the present invention provides a semiconductor structure, including:

a substrate including an active area (AA) and a shallow trench isolation (STI) region, with an upper surface of the shallow trench isolation region being lower than an upper surface of the active area;

a stacked structure covered the substrate;

a first insulating layer covered on the stacked structure;

a second insulating layer covered on the first insulating layer disposed on the shallow trench isolation region;

a third insulating layer disposed on the second insulating layer, with an upper surface of the third insulating layer being coplanar with an upper surface of the first insulating layer disposed on the active area.

In some embodiments, materials of the first insulating layer, the second insulating layer and the third insulating layer are different.

In some embodiments, an etching selectivity of the third insulating layer is greater than an etching selectivity of the first insulating layer, and is smaller than an etching selectivity of the second insulating layer.

In some embodiments, the stacked structure includes:

a dielectric layer covered on the substrate;

a conductive layer disposed on the dielectric layer.

In some embodiments, the semiconductor structure further includes: an insulating spacer layer disposed on sidewalls of the stacked structure and the first insulating layer, and the second insulating layer covered the insulating spacer layer.

A second object of the present invention provides a method of fabricating a semiconductor structure, including:

providing a substrate, the substrate including an active area and a shallow trench isolation region, with an upper surface of the shallow trench isolation region being lower than an upper surface of the active area;

sequentially depositing a stacked structure, a first insulating layer, a second insulating layer, and a third insulating layer, wherein a thickness of the third insulating layer is greater than or equal to a thickness of the second insulating layer, and a height difference between the second insulating layer disposed on the shallow trench isolation region and the second insulating layer disposed on the active area;

polishing the third insulating layer with a first polishing rate, till exposing the second insulating layer disposed on the active area;

polishing the second insulating layer with a second polishing rate, till exposing the first insulating layer disposed on the active area, wherein the second polishing rate is different form the first polishing rate;

continuously polishing the third insulating layer, with an upper surface of the third insulating layer being coplanar with an upper surface of the first insulating layer disposed on the active area.

In some embodiments, the continuously polishing the third insulating layer, with an upper surface of the third insulating layer being coplanar with an upper surface of the first insulating layer disposed on the active area includes:

polishing the third insulating layer with a third polishing rate, with the upper surface of the third insulating layer being coplanar with the upper surface of the first insulating layer disposed on the active area, wherein the third polishing rate is different from or the same as the first polishing rate, and the third polishing rate is different from the second polishing rate.

In some embodiments, a first polishing solution is used for polishing the third insulating layer with the first polishing rate; a second polishing solution is used for polishing the second insulating layer with the second polishing rate, and the first polishing solution is different from the second polishing solution.

In some embodiments, after exposing the first insulating layer disposed on the active area, the first insulating layer, the second insulating layer, and the third insulating layer are continuously polished with a fourth polishing rate, till the first insulating layer disposed on the active area reached to a predict thickness.

In some embodiments, a fourth polishing solution is used for polishing the first insulating layer, the second insulating layer, and the third insulating layer with the fourth polishing rate.

In some embodiments, materials of the first insulating layer, the second insulating layer and the third insulating layer are different.

In some embodiments, an etching selectivity of the third insulating layer is greater than an etching selectivity of the first insulating layer, and is smaller than an etching selectivity of the second insulating layer.

In some embodiments, the sequentially depositing the stacked structure on the substrate includes:

sequentially depositing a dielectric layer and a conductive layer on the substrate.

A third object of the present invention provides a semiconductor device including the semiconductor structure accordingly to any one above.

In comparison with the prior arts, one or more embodiments of the aforementioned schemes may have the following advantages or beneficial effects:

according to the semiconductor structure provided by the present invention, the structure including a substrate having an active area and a shallow trench isolation region, wherein an upper surface of the shallow trench isolation region is lower than an upper surface of the active area; a stacked structure disposed on the substrate; a first insulating layer covered on the stacked structure, a second insulating layer covered on the first insulating layer, and a third insulating layer disposed on the second insulating layer, over the shallow trench isolation region; a first insulating layer covered on the stacked structure, over the active area, wherein an upper surface of the third insulating layer is coplanar with an upper surface of the first insulating layer disposed over the active area. The structure is sufficient to provide the semiconductor structure with a flat upper surface, to avoid polishing the first insulating layer disposed over the active area to level with the first insulating layer disposed on the shallow trench isolation region with the conventional technique, which greatly increases the risk of leakage and reduces the working stability of semiconductor devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. The drawings include:

FIG. 3 illustrating a schematic flow chart of a fabricating method of a semiconductor structure according to one embodiment of the present invention.

FIG. 4 illustrating a schematic flow chart of another fabricating method of a semiconductor structure according to one embodiment of the present invention.

DETAILED DESCRIPTION

To provide a better understanding of the purpose, the technical features, and the advantages of the presented invention, preferred embodiments will be described in detail with accompanying drawings hereinafter, in the with numbered elements. Therefore, it is sufficient to fully realize and to implement the process of how to solve the technical problem and to achieve technical effects by the technical features of the present invention.

According to the conventional fabricating process of the semiconductor structure, a plurality of planarization process is required to provide a flat working surface for the subsequent processes. For the substrate having a shallow trench isolation region and an active area, an upper surface of the shallow trench isolation region is lower than that of the active area while performing a planarization process on a surface of the substrate, due to different materials of the shallow trench isolation region and the active area. Accordingly, a stacked structure and a mask layer formed in the subsequent depositing process will be formed conformally. In order to provide a flat working surface for the subsequent processes, the mask layer covered on the active areas is usually required to be polished to thin out the mask layer thereby, and however, which greatly increases the risk of leakage, and reduces the working stability of semiconductor devices.

Accordingly, the present invention provides a semiconductor structure, the structure including a substrate having an active area and a shallow trench isolation region, wherein an upper surface of the shallow trench isolation region is lower than an upper surface of the active area; a stacked structure conformally disposed on the substrate; a first insulating layer conformally covered on the stacked structure, a second insulating layer covered on the first insulating layer, and a third insulating layer disposed on the second insulating layer, over the shallow trench isolation region; a first insulating layer covered on the stacked structure, over the active area, wherein an upper surface of the third insulating layer is coplanar with an upper surface of the first insulating layer disposed over the active area. The structure is sufficient to provide the semiconductor structure with a flat upper surface, to avoid polishing the first insulating layer disposed over the active area to level with the first insulating layer disposed on the shallow trench isolation region with the conventional technique, which greatly increases the risk of leakage and reduces the working stability of semiconductor devices.

First Embodiment

Figure 1:
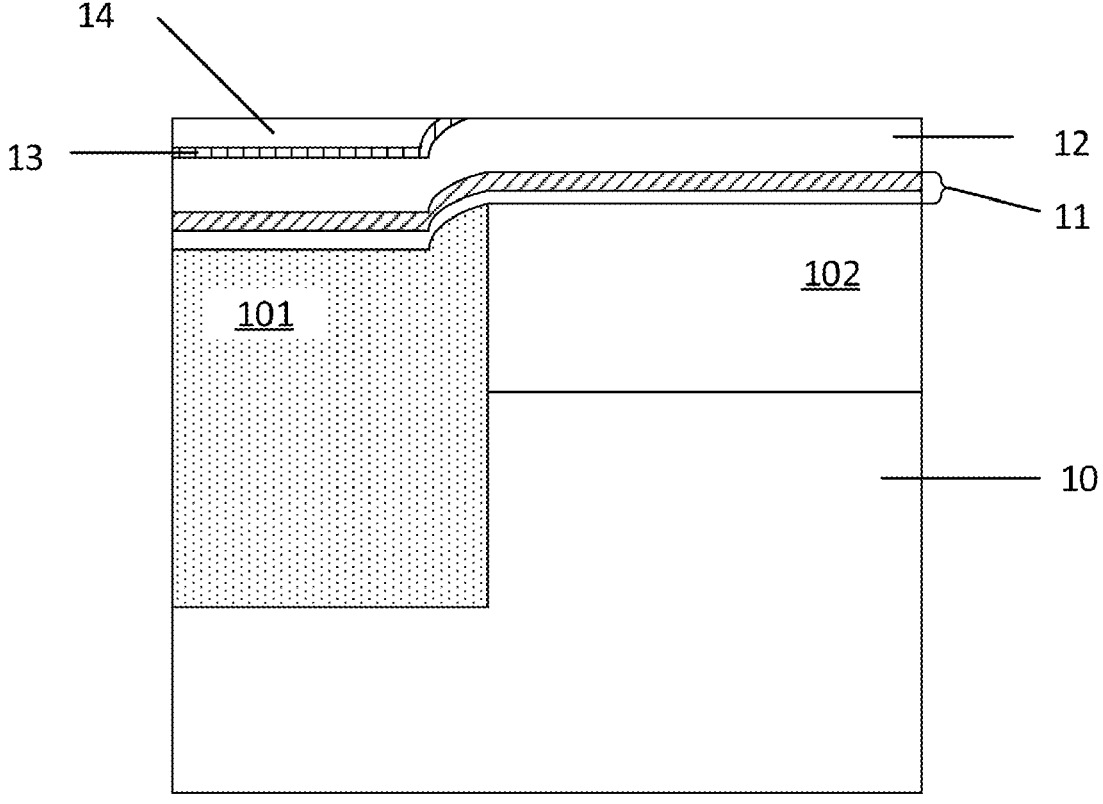
FIG. 1 illustrating a schematic diagram of a cross-sectional view of a semiconductor structure according to one embodiment of the present invention.

Please refers to FIG. 1, and FIG. 1 illustrates a schematic diagram of a semiconductor structure according to one embodiment of the present invention, including:

a substrate 10, including a shallow trench isolation region 101 and an active area 102, with an upper surface of the shallow trench isolation region 101 being lower than an upper surface of the active area 102;

a stacked structure 11, conformally disposed on the substrate 10;

a first insulating layer 12, conformally covered on the stacked structure 11;

a second insulating layer 13, covered on the first insulating layer 12 disposed on the shallow trench isolation region 101;

a third insulating layer 14, disposed on the second insulating layer 13, with an upper surface of the third insulating layer 14 being coplanar with an upper surface of the first insulating layer 12 disposed over the active area 102.

In some embodiments, the substrate 10 may include a silicon substrate, a silicon-on-insulator (SOI) substrate, a germanium substrate and a silicon germanium substrate.

Based on requirements, the stacked structure 11 may be further deposited on the substrate 10, wherein the stacked structure 11 may include a dielectric layer covered on the substrate 10, and a conductive layer disposed on the dielectric layer, the dielectric layer and the conductive layer are conformal with the substrate 10. Namely, the stacked structure 11 conformally covered on the substrate 10 also presents that an upper surface of the stacked structure 11 over the shallow trench isolation region 101 is lower than an upper surface of the stacked structure 11 over the active area 102.

In some embodiments, the dielectric layer may include a silicon oxide layer or a silicon nitride layer, and the conductive layer may include a polysilicon layer.

In some embodiment, the first insulating layer 12 is conformally covered the stacked structure 11, and an upper surface of the first insulating layer 12, over the shallow trench isolation region 101 is lower than an upper surface of the first insulating layer 12, over the active area 102. As an example, the first insulating layer 12 may include a silicon nitride layer or a silicon oxynitride layer.

The second insulating layer 13 conformal with the first insulating layer 12 and the third insulating layer 14 with a flat upper surface are sequentially formed on the shallow trench isolation region 101. In some embodiments, materials of the first insulating layer 12, the second insulating layer 13, and a third insulating layer 14 are different. The first insulating layer 12, the second insulating layer 13, and the third insulating layer 14 may include different etching resistance under the same etching condition. In some embodiments, an etching selectivity of the third insulating layer 14 may be greater than an etching selectivity of the first insulating layer 12, and may be smaller than an etching selectivity of the second insulating layer 13.

In some embodiments, a thickness of the second insulating layer 13 may be smaller than a thickness of the third insulating layer 14 and/or the first insulating layer 12. In order to increase the convenience of the subsequent etching, the second insulating layer 13 with a thin film may be optionally disposed, so that, the thickness of the second insulating layer 13 may be far smaller than the thickness of the third insulating layer 14, or far smaller than a height difference between the first insulating layer 12 disposed over the active area 102 and the first insulating layer 12 disposed over the shallow trench isolation region 101.

In the present embodiment, the upper surface of the third insulating layer 14 and the upper surface of the first insulating layer 12 disposed over the active area 12 are coplanar with each other. On the basis of ensuring that a masking layer with sufficient thickness is provided for the conductive layer to avoid leakage, a semiconductor structure with a flat upper surface is formed by disposing a laminated structure formed by the second insulating layer 13 and the third insulating layer 14 on the first insulating layer 12 over the shallow trench isolation region 101, which is beneficial on providing convenience for subsequent processes and improving the performance of the semiconductor device.

Figure 2:
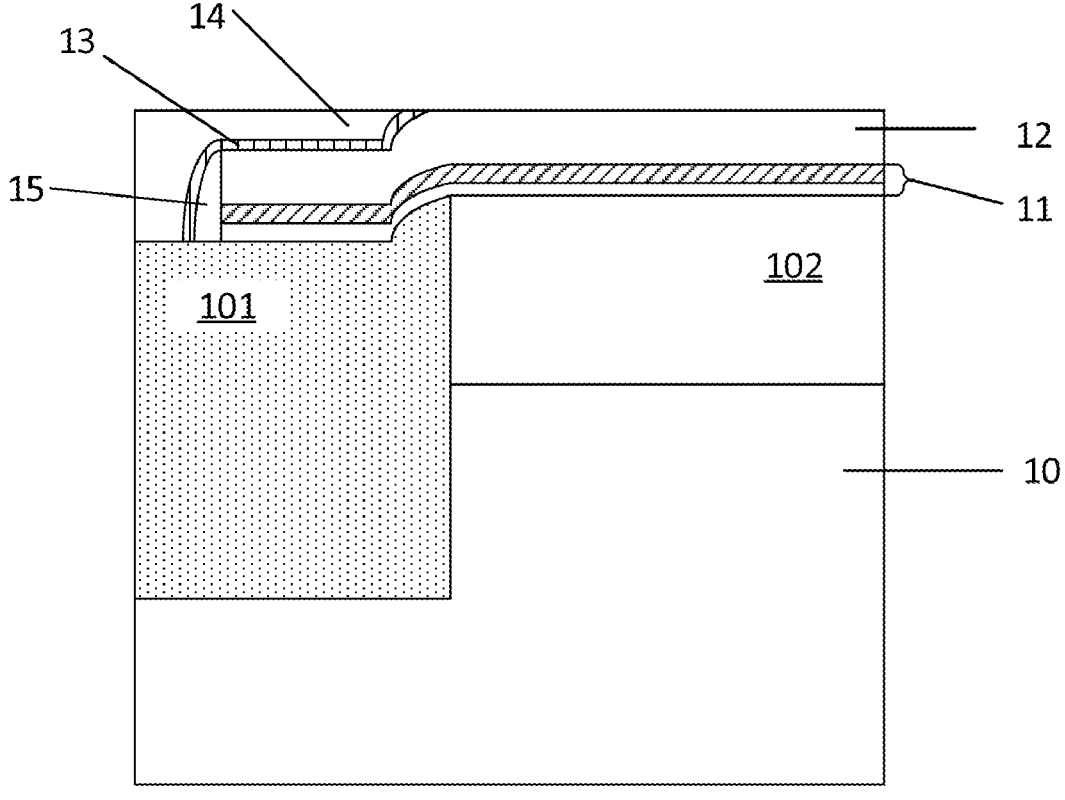
FIG. 2 illustrating a schematic diagram of a cross-sectional view of another semiconductor structure according to one embodiment of the present invention.

In other embodiments, please refer to FIG. 2, which illustrate a schematic diagram of a cross-sectional view of another semiconductor structure according to one embodiment of the present invention. The semiconductor structure may further includes: an insulating spacer layer 15, disposed on sidewalls of the stacked structure 11 and the first insulating layer 12, and the second insulating layer 13 covers the insulating spacer layer 15. Namely, in one embodiments of the present invention, a gate structure may be formed by forming the stacked structure 11, the first insulating layer 12 and the insulating spacer layer 15, and the second insulating layer 13 and the third insulating layer 14 are disposed to cover the gate structure. The insulating spacer layer 15 may be disposed on the upper surface of the shallow trench isolation region 101, and the insulating spacer layer 15 may be formed with a material like silicon nitride.

The above is a semiconductor structure provided by one embodiment of the present invention, the structure includes the substrate 10 including the shallow trench isolation region 101 and the active area 102, wherein the upper surface of the shallow trench isolation region 101 is lower than the upper surface of the active area 102; the stacked structure 11 conformally covered the substrate 10; the first insulating layer 12 covered the stacked structure 11, the second insulating layer 13 covered the first insulating layer 12, and a third insulating layer 14 covered the second insulating layer 12, over the shallow trench isolation region 101; the first insulating layer 12 covered the stacked structure 11, over the active area, with the upper surface of the first insulating layer 12 being coplanar with the upper surface of the third insulating layer 14. The structure may provide a semiconductor structure having a flat upper surface, to avoid polishing the first insulating layer 12 over the active area 102 to level with the first insulating layer 12 over the shallow trench isolation region 101 with the conventional technique, which greatly increases the risk of leakage, and reduces the working stability of semiconductor devices.

The above is a semiconductor structure provided by one embodiment of the present invention, the present invention further provides a method of fabricating a semiconductor structure, and please refer to the detail description in the second embodiment.

Second Embodiment

Please refer to FIG. 3, which illustrates a schematic flow chart of a fabricating method of a semiconductor structure according to one embodiment of the present invention, including:

a step S101: providing a substrate, the substrate including an active area and a shallow trench isolation region, with an upper surface of the shallow trench isolation region being lower than an upper surface of the active area;

a step S102: sequentially and conformally depositing a stacked structure, a first insulating layer, a second insulating layer, and a third insulating layer covered on the substrate, with a thickness of the third insulating layer being greater than or equal to a thickness of the second insulating layer, and a height difference between the second insulating layer disposed over the shallow trench isolation region and the second insulating layer disposed over the active area;

a step S103: polishing the third insulating layer with a first polishing rate, till exposing the second insulating layer disposed over the active area;

a step S104: polishing the second insulating layer with a second polishing rate, till exposing the first insulating layer disposed over the active area, wherein the second polishing rate is different from the first polishing rate;

a step S105: continuously polishing the third insulating layer, with an upper surface of the third insulating layer being coplanar with an upper surface of the first insulating layer disposed over the active area.

In one embodiment of the present invention, the polishing rate may be controlled by selecting different materials as insulating layers and/or selecting different polishing solutions, and finally, the height adjustment between the upper surface of the semiconductor structure over the shallow trench isolation region and the upper surface over the active area is adjusted based on the adjustment of the polishing rate.

As an example, while polishing the third insulating layer with a first polishing solution at the first polishing rate until exposing the second insulating layer, the upper surface of the currently reserved third insulating layer is higher than the upper surface of the first insulating layer over the active area and lower than the upper surface of the exposed second insulating layer. Furthermore, the second insulating layer may be polished by using a second polishing solution at the second polishing rate, while the third insulating is still polishing with the first polishing rate at the same time, and the second polishing rate is greater than the first polishing rate, so that the first insulating layer is exposed and the upper surface of the third insulating layer is coplanar with the upper surface of the first insulating layer arranged over the active area. In other embodiments, while the second insulating layer is exposed, the third insulating layer may be continuously polished at the third polishing rate, which may be different from the first polishing rate, so that the upper surface of the third insulating layer is coplanar with the upper surface of the first insulating layer over the active area. The third polishing rate may be accomplished by selecting a suitable third grinding fluid.

In other embodiments, the polishing may be performed at different polishing rates based on the corresponding upper surface topography when the second insulating layer is exposed, so as to realize the height control. Please refer to the following description to find precise details.

Please refer to FIG. 4, while illustrate a schematic flow chart of a fabricating method of a semiconductor structure according to one embodiment of the present invention, including:

a step S201: providing a substrate 20, the substrate 20 including a shallow trench isolation region 201 and an active area 202, with an upper surface of the shallow trench isolation region 201 being lower than an upper surface of the active area 202;

a step S202: sequentially and conformally depositing a stacked structure 21, a first insulating layer 22, a second insulating layer 23, and a third insulating layer 24 covered on the substrate 20, with a thickness of the third insulating layer 24 being greater than or equal to a thickness of the second insulating layer 23, and a height difference between the second insulating layer 23 disposed over the shallow trench isolation region 201 and the second insulating layer 23 disposed over the active area 202;

a step S203: polishing the third insulating layer 24 with a first polishing rate, till exposing the second insulating layer 23 disposed over the active area 202, and an upper surface of the third insulating layer 24 is coplanar with an upper surface of the second insulating layer 23 after the polishing;

a step S204: polishing the second insulating layer 23 with a second polishing rate, till exposing the first insulating layer 22 disposed over the active area 202, wherein the first polishing rate is smaller than the second polishing rate; and a step S205: polishing the third insulating layer 24 with a third polishing rate, with an upper surface of the third insulating layer 24 being coplanar with an upper surface of the first insulating layer 22 disposed over the active area 202.

In one embodiment of the present invention, the substrate 20 may include a silicon substrate, a silicon-on-insulator substrate, a germanium substrate and a silicon germanium substrate. Since the materials of the active area 202 and the shallow trench isolation region 201 in the substrate 20 are different, upper surfaces of the substrate 20 in the shallow trench isolation region 201 and in the active area 202 are uneven during the fabricating process, and the upper surface of the shallow trench isolation region 201 is lower than the upper surface of the active area 202, as shown in FIG. 5.

In one embodiment of the present invention, the step S202 may precisely include sequentially and conformally depositing the stacked structure 21, the first insulating layer 22, the second insulating layer 23, and the third insulating layer 24 through a chemical vapor deposition process or a physical vapor deposition process.

Figures 5, 6:
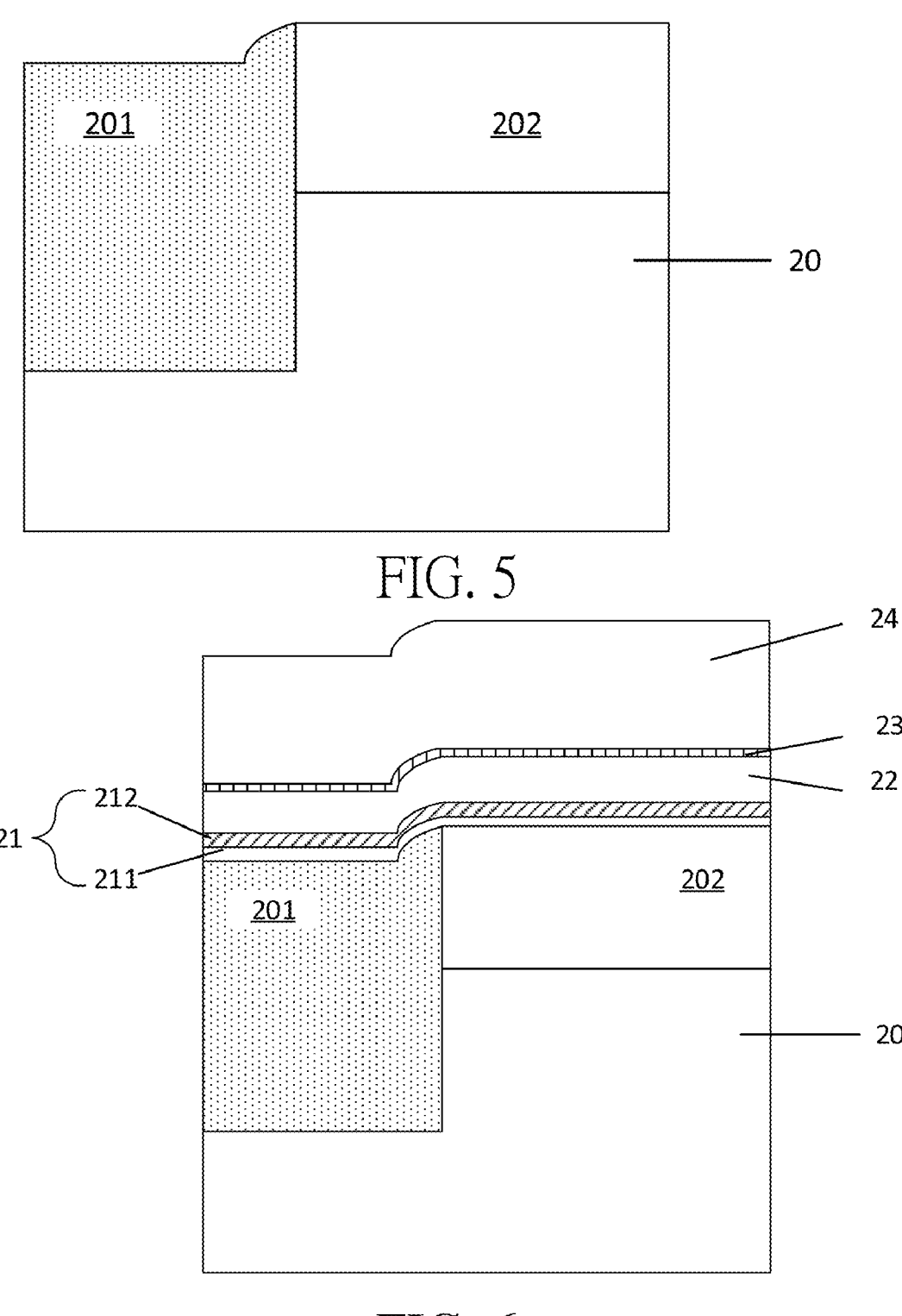
FIG. 5 to FIG. 9 illustrating schematic diagrams of cross-sectional views of each step of a fabricating method of a semiconductor structure according to one embodiment of the present invention.

Please refer to FIG. 6, the stacked structure 21, the first insulating layer 22, the second insulating layer 23, and the third insulating layer 24 are conformal with the substrate 20, and an upper surface of the third insulating layer 24 formed over the shallow trench isolation region 201 is lower than an upper surface of the third insulating layer 24 over the active area 201. In some embodiments, a thickness of the third insulating layer 24 may be greater than or equal to a thickness of the second insulating layer 23, and a height different between the second insulating layer 23 disposed over the active area 202 and the second insulating layer 23 disposed over the shallow trench isolation region 201, to ensure that the upper surface of the third insulating layer 24 over the shallow trench isolation region 201 is higher than the exposed upper surface of the first insulating layer 22 over the active area 202 while adjusting the height by the polishing process. The first insulating layer 22, the second insulating layer 23, and the third insulating layer 24 include different materials.

In some embodiments, the stacked structure 21 may include a dielectric layer 211 and a conductive layer 212, and the sequentially and conformally depositing the stacked structure 21 on the substrate 20 may include: sequentially and conformally depositing the dielectric layer 211 and the conductive layer 212 on the substrate 20 through a physical vapor deposition process or a chemical vapor deposition process, wherein the dielectric layer 211 may include a silicon oxide layer or a silicon nitride layer, and the conductive layer 212 may include polysilicon.

In some embodiments, the step S203 may precisely include polishing the third insulating layer 24 at the first polishing rate by using the first polishing solution, until exposing the upper surface of the second insulating layer 23 over the active area 202, and stopping the etching while the upper surface of the remain third insulating layer 24 is basically coplanar with the upper surface of the second insulating layer 23. The schematic cross-sectional structure after etching is shown in FIG. 7.

In the step S202, the third insulating layer 24 is disposed to conformal with the substrate 20, so that the upper surface of the third insulating layer 24 over the shallow trench isolation region 201 is lower than the upper surface of the third insulating layer 24 over the active area 202. In the step S203, a dry etching process or a wet etching process may be combined with the polishing process to remove a part of the third insulating layer 24. As an example, the dry etching process or the wet etching process may be firstly performed to remove a part of the third insulating layer 24, and the polishing process is performed to form the third insulating layer 24 with a horizontal upper surface, and to expose the upper surface of the second insulating layer 23 over the active area 202.

In some embodiments, the polishing rate of the etching may be adjusted by selecting different insulating layers with different etching selectivity ratios. While the materials of the first insulating layer 22, the second insulating layer 23 and the third insulating layer 24 are different, the etching selectivity of the third insulating layer 24 may be smaller than that of the second insulating layer 23. The step S204 and the step S205 may precisely include simultaneously polishing the third insulating layer 24 at the third polishing rate and polishing the exposed second insulating layer 23 at the second polishing rate under the same polishing condition, until the first insulating layer 22 disposed over the active area 202 is exposed.

Figures 7, 8:
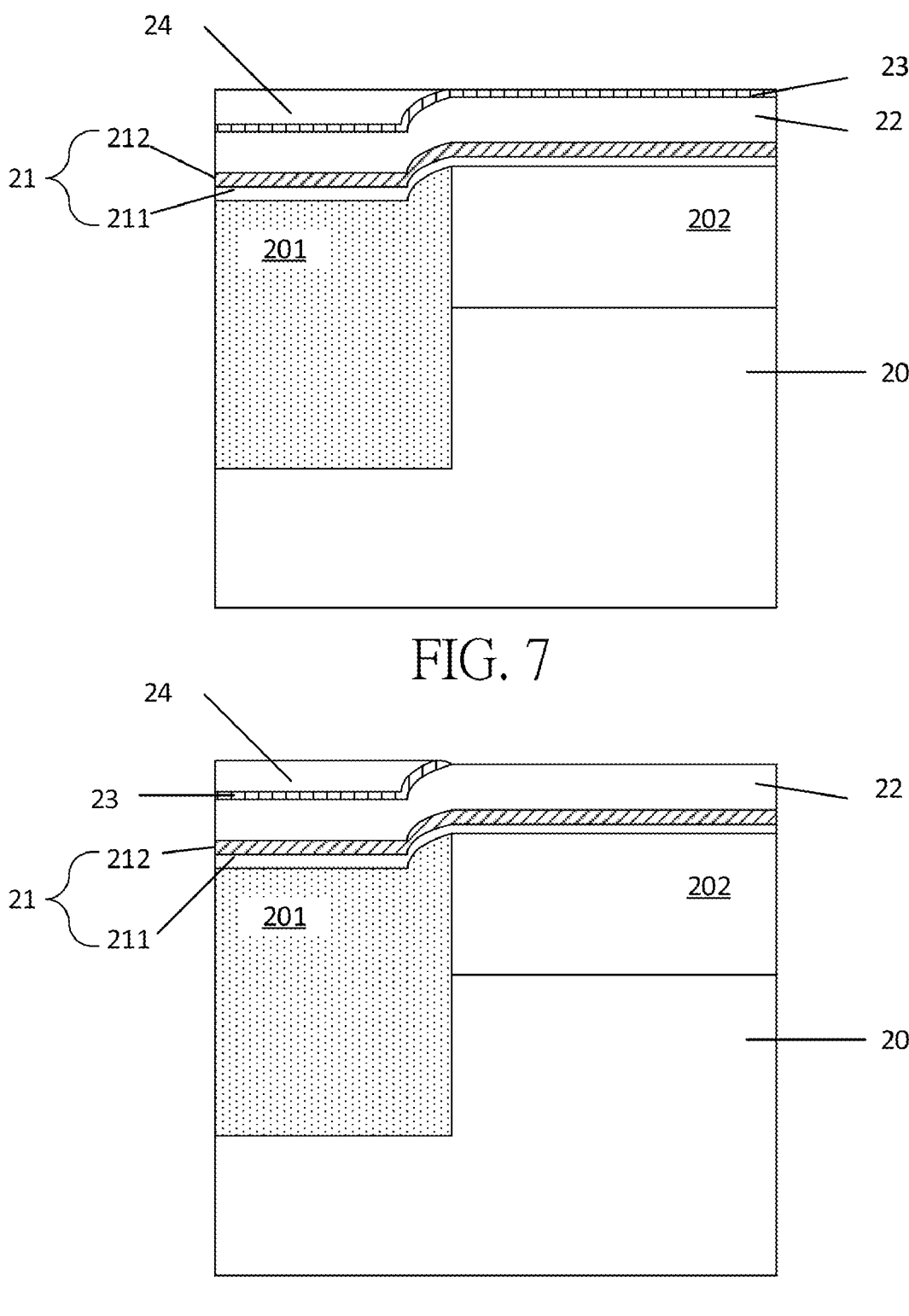

Since the etching selectivity ratios of the third insulating layer 24 and the second insulating layer 23 are different, while performing the polishing under the same polishing condition, namely with the third polishing rate being smaller than the second polishing rate, until exposing the first insulating layer 22 over the active area 202, the upper surface of the third insulating layer 24 over the shallow trench isolation region 201 is higher than that of the first insulating layer 22, as shown in FIG. 8. Therefore, the polishing rate is controlled based on the difference between the etching selectivity between the third insulating layer 24 and the second insulating layer 23, which is further beneficial to the adjustment of the height between the third insulating layer 24 and the second insulating layer 23 after polishing.

In some embodiment, the polishing rate may also be adjusted by selecting different etching conditions. The step S204 may precisely include polishing the third insulating layer 24 with different polishing solutions at the third polishing rate, and polishing the exposed second insulating layer 23 at the second polishing rate, until exposing the first insulating layer 22 disposed over the active area 202.

By using different polishing solutions, the third polishing rate is smaller than the second polishing rate while polishing the third insulating layer 24 and the second insulating layer 23. When the first insulating layer 22 over the active area 202 is polished to be exposed, the upper surface of the third insulating layer 24 over the shallow trench isolation region 201 is higher than the upper surface of the first insulating layer 22. Therefore, the polishing rate is controlled by using different polishing solutions, which is further beneficial to the adjustment of the height between the third insulating layer 24 and the second insulating layer 23 after polishing.

Figure 9:
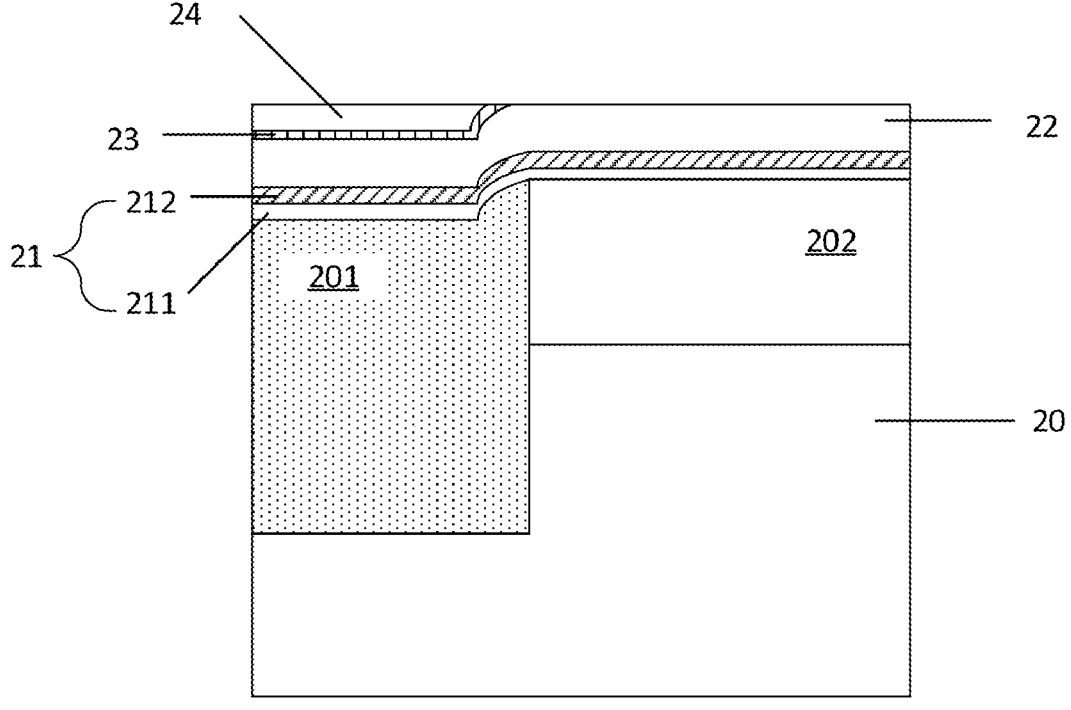

In some embodiments, the step S205 may precisely include polishing the third insulating layer 24 at the third polishing rate under the same condition, so that the upper surface of the third insulating layer 24 is coplanar with the upper surface of the first insulating layer 22 disposed over the active area 202, as shown in FIG. 9 in detail.

The etching selectivity ratio of the third insulating layer 24 is greater than that of the first insulating layer 22. Through performing the polishing under the same polishing conditions, a semiconductor structure with a flat upper surface is beneficial to be provided without dramatically thinning out the first insulating layer 22. In addition, through ensuring the thickness of the first insulating layer 22, the isolation effect on leakage may be effectively ensured, which is beneficial on improving the working stability of the semiconductor device.

In some embodiments, the step S205 may precisely include polishing the third insulating layer 24 at the third polishing rate by using the third polishing solution, so that the upper surface of the third insulating layer 24 is coplanar with the upper surface of the first insulating layer 22 disposed over the active area 202.

By using different polishing solutions, the third polishing rate is smaller than the second polishing rate while polishing the third insulating layer 24 and the first insulating layer 22, and the height difference between the upper surface of the third insulating layer 24 and the exposed upper surface of the first insulating layer 22 may be eliminated by prolonging the polishing time, to achieve planarization thereby. Therefore, the polishing rate is controlled by using different polishing solutions, which is further beneficial to the adjustment of the height between the third insulating layer 24 and the first insulating layer 22 after polishing.

In other embodiments, a fourth polishing solution is further used to polishing the first insulating layer 22, the second insulating layer 23, and the third insulating layer 24 at a fourth polishing rate, till the first insulating layer 22 over the active area reaching a predict thickness.

It is noted that, the third polishing rate may be the same as the first polishing rate, wherein the polishing rate while the polishing may be adjusted based on any polishing requirement like the height difference of the insulating layer.

The above is a method of fabricating a semiconductor structure provided by one embodiment of the present invention, including providing a substrate 20 including the active area 202 and a shallow trench isolation region 201, wherein the upper surface of the shallow trench isolation region 201 is lower than the upper surface of the active area 202; sequentially and conformally depositing the stacked structure 21, the first insulating layer 22, the second insulating layer 23, and the third insulating layer 24 covered on the substrate 20, with the thickness of the third insulating layer 24 is greater than or equal to the thickness of the second insulating layer 23, and a height difference between the second insulating layer 23 disposed over the shallow trench isolation region 201 and the second insulating layer 23 disposed over the active area 202; polishing the third insulating layer 24 with the first polishing rate, till exposing the second insulating layer 23 disposed over the active area 202; polishing the second insulating layer 23 with the second polishing rate, till exposing the first insulating layer 22 disposed over the active area 202, wherein the second polishing rate is different from the first polishing rate; and polishing the third insulating layer 24 with the third polishing rate, with the upper surface of the third insulating layer 24 being coplanar with the upper surface of the first insulating layer 22 disposed over the active area 202. In the present method, the second insulating layer 23 and the third insulating layer 24 are disposed on the first insulating layer 22, and the polishing rate is controlled based on the difference of etching selectivity ratios between different insulating layers or different polishing conditions, so that the height difference of the insulating layers over the active area 202 and the shallow trench isolation region 201 may be adjusted, which is beneficial on providing a semiconductor structure with a flat upper surface without dramatically thinning out the first insulating layer 22. In addition, by ensuring the layer thickness of the first insulating layer 22, the isolation effect on leakage may be effectively achieved, which is beneficial on improving the working stability of the semiconductor device.

Another aspect of the present invention further provides a semiconductor device, which may include the semiconductor structure accordingly any one of the above mentioned embodiments.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate, comprising an active area and a shallow trench isolation region, an upper surface of the shallow trench isolation region being lower than an upper surface of the active area;
   a stacked structure, covering the upper surfaces of the active area and the shallow trench isolation region;
   a first insulating layer, covered on the stacked structure, the first insulating layer simultaneously contacting the stacked structure disposed on the active area and the shallow trench isolation region;
   a second insulating layer, covered on the first insulating layer disposed on the shallow trench isolation region, the second insulating layer contacting an upper surface of the first insulating layer disposed on the shallow trench isolation region; and
   a third insulating layer, disposed on the second insulating layer and contacting an upper surface of the second insulating layer, an upper surface of the third insulating layer being coplanar with an upper surface of the first insulating layer disposed on the active area.

2. The semiconductor structure according to claim 1, wherein materials of the first insulating layer, the second insulating layer and the third insulating layer are different.

3. The semiconductor structure according to claim 2, wherein an etching selectivity of the third insulating layer is greater than an etching selectivity of the first insulating layer, and is smaller than an etching selectivity of the second insulating layer.

4. The semiconductor structure according to claim 1, wherein the stacked structure comprises:
   a dielectric layer covered on the substrate;
   a conductive layer disposed on the dielectric layer.

5. The semiconductor structure according to claim 1, wherein the semiconductor structure further comprising: an insulating spacer layer disposed on sidewalls of the stacked structure and the first insulating layer, and the second insulating layer covered the insulating spacer layer.

6. The semiconductor structure according to claim 1, wherein a bottommost surface of the second insulating layer is higher than an upper surface of the stack structure.

7. A semiconductor structure, comprising:
   a substrate, comprising an active area and a shallow trench isolation region, an upper surface of the shallow trench isolation region being lower than an upper surface of the active area;
   a stacked structure, covering the upper surfaces of the active area and the shallow trench isolation region;
   a first insulating layer, covered on the stacked structure, the first insulating layer simultaneously contacting the stacked structure disposed on the active area and the shallow trench isolation region;
   a second insulating layer, covered on the first insulating layer disposed on the shallow trench isolation region, the second insulating layer contacting the first insulating layer disposed on the shallow trench isolation region;
   a third insulating layer, disposed on the second insulating layer, an upper surface of the third insulating layer being coplanar with an upper surface of the first insulating layer disposed on the active area; and
   an insulating spacer layer disposed on sidewalls of the stacked structure and the first insulating layer, and the second insulating layer covered the insulating spacer layer.

8. The semiconductor structure according to claim 7, wherein a bottommost surface of the second insulating layer is higher than an upper surface of the stack structure.

9. The semiconductor structure according to claim 7, wherein materials of the first insulating layer, the second insulating layer and the third insulating layer are different.

10. The semiconductor structure according to claim 9, wherein an etching selectivity of the third insulating layer is greater than an etching selectivity of the first insulating layer, and is smaller than an etching selectivity of the second insulating layer.

11. The semiconductor structure according to claim 7, wherein the stacked structure comprises:
   a dielectric layer covered on the substrate;
   a conductive layer disposed on the dielectric layer.

* * * * *